United States Patent
Kittl et al.

[11] Patent Number: 6,004,871
[45] Date of Patent: Dec. 21, 1999

[54] IMPLANT ENHANCEMENT OF TITANIUM SILICIDATION

[75] Inventors: Jorge Adrian Kittl, Plano; Keith A. Joyner, Richardson; George R. Misium, Plano, all of Tex.

[73] Assignee: Texas Instruments Incorporated, Dallas, Tex.

[21] Appl. No.: 08/868,173

[22] Filed: Jun. 3, 1997

Related U.S. Application Data

[60] Provisional application No. 60/019,120, Jun. 3, 1996.

[51] Int. Cl.[6] .................. H01L 21/3205; H01L 21/4763
[52] U.S. Cl. ............................................ 438/592; 438/683
[58] Field of Search ................................ 438/592, 683, 438/301, 303, 528

[56] References Cited

U.S. PATENT DOCUMENTS

| | | | |
|---|---|---|---|
| 4,540,607 | 9/1985 | Tsao | 427/253 |
| 4,900,257 | 2/1990 | Maeda | 437/200 |
| 5,444,024 | 8/1995 | Anjum et al. | |
| 5,468,974 | 11/1995 | Aronowitz et al. | 257/51 |
| 5,710,438 | 1/1998 | Oda et al. | 257/69 |
| 5,776,822 | 7/1998 | Fujii et al. | 438/586 |

FOREIGN PATENT DOCUMENTS

| | | |
|---|---|---|
| 0 523 701 | 2/1993 | European Pat. Off. . |
| WO 94/24697 | 10/1994 | WIPO . |

OTHER PUBLICATIONS

"A Ti Salicide Process for 0.10μ m Gate Length CMOS Technology", 1996 Symposium on VLSI Technology Digest of Technical Papers, pp. 14–15 (Jorge A. Kittl, Qi–Zhong Hong, Mark Rodder, Douglas A. Prinslow and George R. Misium).

*Primary Examiner*—Richard Booth
*Attorney, Agent, or Firm*—Jacqueline J. Garner; Wade James Brady; Richard L. Donaldson

[57] ABSTRACT

A method of forming silicided narrow (i.e., sub-0.25 μm) polysilicon lines. A layer of titanium is deposited over a semiconductor body having polysilicon lines formed thereon Either before or after the titanium deposition and before the react step, an implant is performed using a gas that will not poison the subsequent silicidation reaction. Exemplary gases include the noble element gases such as argon, krypton, xenon, and neon. The titanium is then reacted with the polysilicon lines to form titanium silicide. The gas implant causes the C49 grain size of the titanium silicide to be reduced, which makes the transformation to the C54 phase easier. Finally, an anneal is performed to transform the titanium silicide from the C49 phase to the C54 phase.

18 Claims, 3 Drawing Sheets

IMPLANT ENHANCEMENT OF TITANIUM SILICIDATION

This application claims priority under 35 USC § 119 (e)(1) of provisional application Ser. No. 60/019,120, filed Jun. 03, 1996.

FIELD OF THE INVENTION

This invention generally relates to semiconductor processing and more specifically to titanium silicide formation

BACKGROUND OF THE INVENTION

As semiconductor technology progresses, the resistance of polysilicon lines used to form gates of MOSFET transistors becomes unacceptably high. As a result, silicide (such as titanium silicide) is commonly added to the polysilicon lines to reduce the resistance. In a self-aligned (salicide) process, a layer of titanium is deposited over the structure and reacted in a nitrogen ambient at temperatures on the order of 650–750° C. The titanium layer reacts with the silicon of the polysilicon lines and/or the source/drain regions to form a titanium-silicide layer and with the nitrogen ambient to form a titanium nitride layer. The titanium nitride and any unreacted titanium are then removed. An anneal on the order of 800–900° C. is then used to lower the sheet resistance and stabilize the titanium silicide phase (i.e., transform C49 phase titanium silicide to a lower resistance C54 phase).

The lower resistance C54 phase of titanium silicide is preferred over the higher resistance C49 phase. Unfortunately, as device geometries shrink, it becomes more and more difficult to transform the C49 phase to the C54 phase. Therefore, it is very difficult to form a low sheet resistance titanium salicide for sub-0.25 $\mu$m CMOS technology. One proposed method to overcome this limitation is to use an arsenic implant prior to titanium deposition The arsenic implant reduces the narrow linewidth effect However, arsenic counterdopes the PMOS regions of CMOS devices if no masks are used for the implant step. Counterdoping is undesirable and induces problems such as higher silicide to source/drain contact resistance. Accordingly, there is a need to extend the usefulness of titanium-silicide to the sub-0.25 $\mu$m technologies without the problems associated with an arsenic implant.

SUMMARY OF THE INVENTION

A method of forming silicided narrow polysilicon lines is disclosed herein. Polysilicon lines are formed on a semiconductor body and a layer of titanium is deposited over the structure. Either before the titanium deposition or after the titanium deposition and before the react step, an implant is performed using a gas that will not poison the subsequent silicidation reaction Exemplary gases include the noble element gases such as argon krypton, xenon, and neon. The titanium is then reacted with the polysilicon lines to form titanium silicide. Finally, an anneal is performed to transform the titanium silicide from the C49 phase to the C54 phase.

An advantage of the invention is providing a silicided narrow polysilicon line having low sheet resistance.

A further advantage of the invention is providing a silicided narrow polysilicon line having low sheet resistance that avoids the effects of chemical reactivity/doping associated with prior art techniques.

These and other advantages will be apparent to those of ordinary skill in the art having reference to the specification in conjunction with the drawings.

DETAILED DESCRIPTION OF PREFERRED EMBODIMENTS

As device dimensions shrink, the sheet resistance of narrow silicided polysilicon lines after a titanium salicide process tends to increase as the linewidth decreases in the sub-micron range. This is known as the narrow linewidth effect. Rapid thermal processing solves the narrow width effect problem in devices having minimum geometries greater than 0.25 $\mu$m. However, device geometries are now shrinking to below 0.25 $\mu$m. The invention will be described in conjunction with a MOSFET process flow. However, it is applicable to narrow titanium silicided lines in general. The invention utilizes a pre-amorphization implant either before titanium deposition or after deposition and before react using a gas implant that does not poison the silicidation process. The gas, for example one of the noble elements, does not act as a dopant and therefore no masking steps are necessary. In addition, there is no chemical reactivity between the gas and the salicide. The pre-amorphization implant reduces the narrow linewidth effect for device geometries smaller than 0.25 $\mu$m.

Figure 1A:
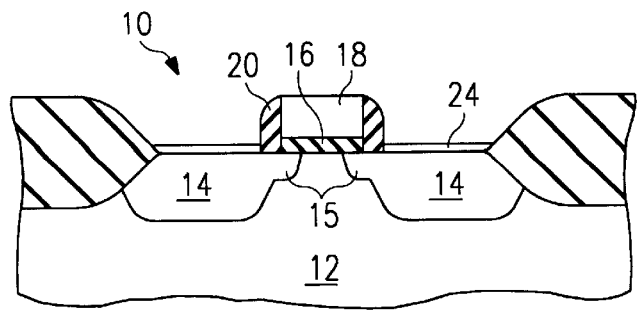
FIGS. 1a–e are cross-sectional diagrams illustrating a transistor undergoing the process according to a first embodiment of the invention.

A more detailed description of a method of forming narrow silicided polysilicon lines according to a first embodiment of the invention will now be discussed with reference to FIGS. 1a–1e. FIG. 1a is a cross-section of a transistor 10 processed through source/drain anneal. Transistor 10 is formed in a semiconductor body 12 and includes source/drain regions 14, lightly-doped drain extensions 15, a gate oxide 16 and polysilicon gate electrode 18. Sidewall dielectric 20 is located on the sidewalls of gate oxide 16 and polysilicon gate electrode 18. Polysilicon gate electrode 18 is actually a long narrow polysilicon line that forms the gate electrode of several transistors. As device dimensions shrink, the width of polysilicon gate electrode 18 shrinks below 0.25 $\mu$m.

Figure 1B:
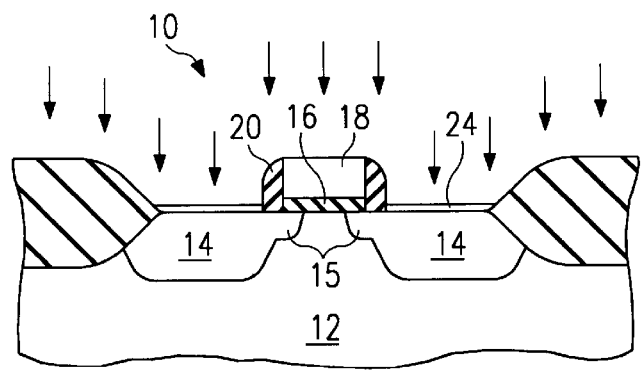

Referring to FIG. 1b, a blanket implant is performed next. The implant is of an inert gas that does not poison the subsequent silicide reaction Examples of gases that may be used include the noble elements such as Argon, Xenon, Neon, and Krypton, Silicon should not be used because it causes interstitials. Oxygen poisons the silicidation reaction Hydrogen and helium are probably too light to be effective. Using an inert gas that does not poison the silicide reaction instead of a dopant avoids both counterdoping the PMOS regions of a CMOS device and the masking requirement used to avoid counterdoping the PMOS regions.

The implant amorphizes the surface of the polysilicon gate electrode 18 and the source/drain regions 14. The dose of the implant is on the order of 3E14/cm2 and greater. However, the dose should not be so high as to cause knock-on or ion-mixing from the screen layer 24 that can poison the subsequent silicide reaction with oxygen The energy of the implant is chosen such that the surface is amorphized to a depth less than the source/drain junction region. This may typically be on the order of ½ the junction depth of the source/drain regions 14. If the amorphized region extends past the junction depth, the implant can interfere with transistor operation causing increased leakage. Preferably, the depth of the amorphized region is matched to the amount of the source/drain regions 14 and polysilicon gate electrode 18 that will be consumed during the subsequent silicide formation Thus, the optimum dose and energy will vary depending on the element implanted, the design parameters of the transistor 10 and the thickness of screen oxide 24 As an example, for an argon pre-amorphization implant through a 100 Å screen oxide to form a 0.18 $\mu$m gate electrode, appropriate energies include approximately 18–20 keV and above with a dose on the order of 5E14.

After the pre-amorphization implant of the inert gas, the screen oxide 24 is removed and standard cleanup steps may be performed. If desired, screen oxide 24 may be removed prior to the pre-amorphization implant In that case, the surface of the structure may also undergo standard cleanup processes prior to the pre-amorphization implant.

Figure 1C:
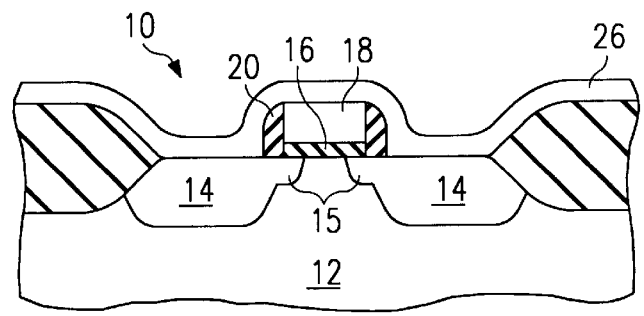
Figure 1D:
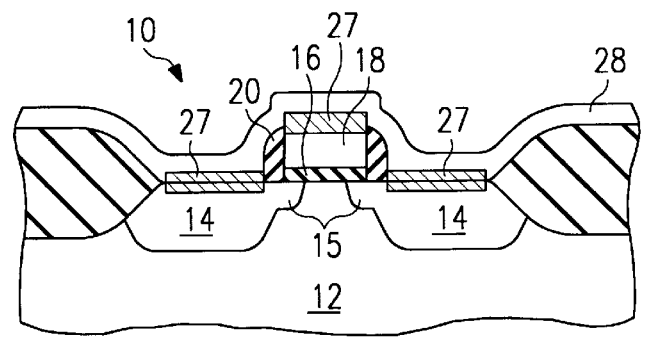

Referring to FIG. 1c, a layer of titanium 26 is deposited over the structure. The thickness of titanium layer 26 is chosen for conventional reasons (i.e., thickness desired for resulting silicide layer, device design parameters, etc.). For example, titanium layer 26 may be on the order of 300 Å thick The titanium layer 26 is then reacted with the silicon in source/drain regions 14 and polysilicon gate electrode 18 in a nitrogen ambient to form a silicide layer 27 as shown in FIG. 1d. For example, a rapid thermal process on the order of 700° C. for on the order of 60 seconds may be used. However, an appropriate furnace treatment may also be used. This react process creates a silicide in a mostly high resistivity phase, known as C49. The pre-amorphization implant of the inert gas causes the C49 grain size to be smaller than it otherwise would be. The C49 grain size created with the pre-amorphization implant is smaller than the polysilicon gate electrode width Having a C49 grain size smaller than the linewidth makes it easier to transform a higher percentage of silicide layer 27 from the C49 phase to a lower resistivity C54 phase during the subsequent anneal. When the polysilicon linewidth is less than the C49 grain size, the thermal budget required to transform the C49 phase to the C54 phase increases dramatically leading to agglomeration. By optimizing the pre-amorphization implant, RTP react process and the subsequent RTP anneal process, a C49 grain size on the order of 0.07 $\mu$m can be achieved.

Figure 1E:
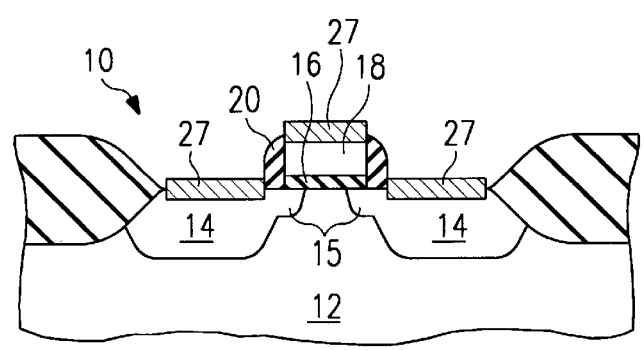

In places where there is no silicon for the titanium layer 26 to react with, titanium nitride 28 is formed. There may also be some unreacted titanium left. As shown in FIG. 1e, the titanium nitride 28 and any unreacted titanium are then removed. Finally, a silicide anneal is performed to transform the titanium-silicide of silicide layer 27 from a higher resistivity C49 phase to a lower resistivity C54 phase. This anneal may be performed either as a rapid thermal process (RTP) or in a furnace. For example, an RTP process at a temperature on the order of 850° C. for on the order of 30 sec. may be used.

Figure 2:
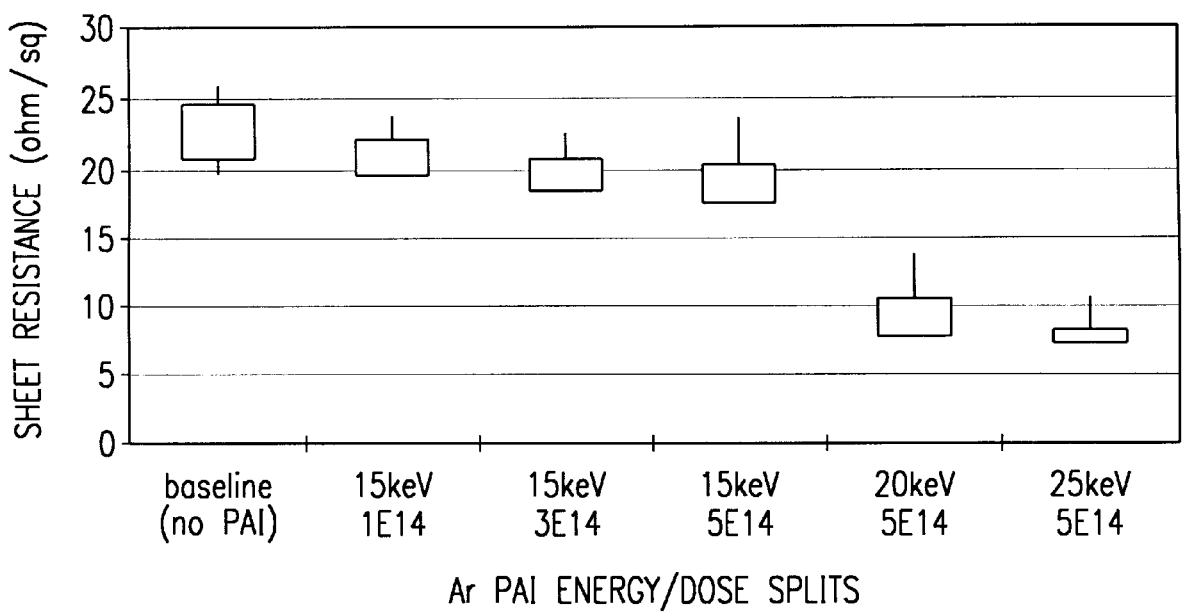
FIG. 2 is a graph of dose/energy of a pre-amorphization implant according to the invention versus silicide sheet resistance of a 0.18 $\mu$m linewidth.
Figure 3:
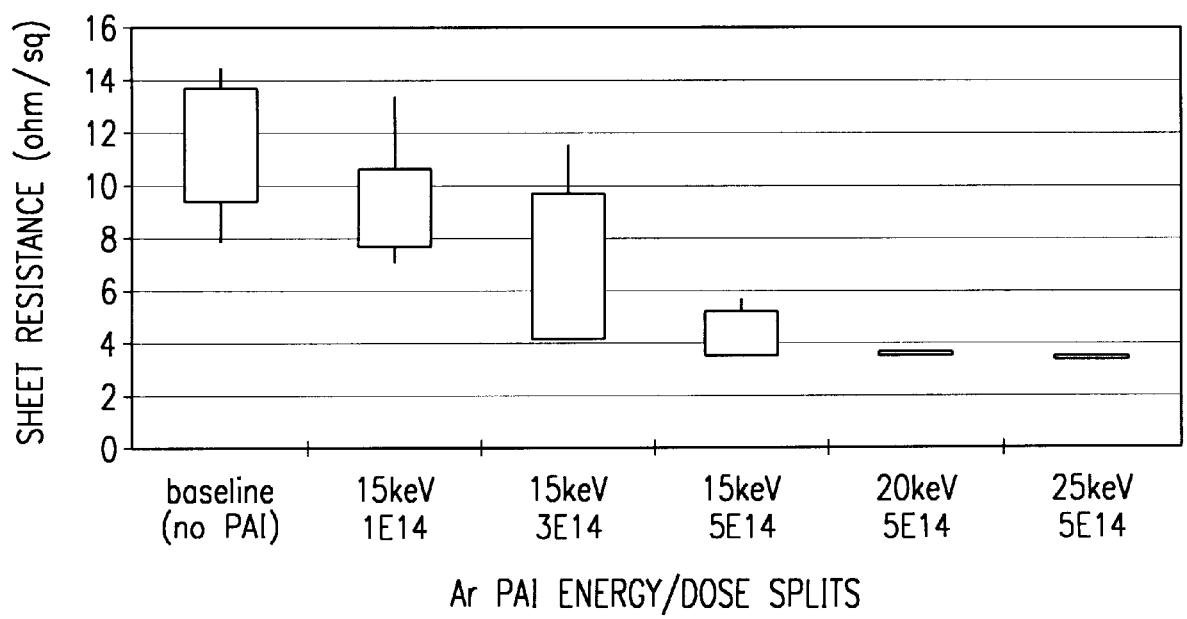
FIG. 3 is a graph of dose/energy of a pre-amorphization implant according to the invention versus silicide sheet resistance of a 0.26 $\mu$m linewidth.

FIGS. 2–3 illustrate the effect of an Argon pre-amorphization implant on a titanium silicided NMOS gate sheet resistance. FIG. 2 shows the effect of various dose/energy splits on sheet resistance for a 0.18 $\mu$m gate. Argon is implanted prior to titanium deposition through a 100 Å screen oxide. A 300 Å layer of titanium is deposited, reacted and annealed. At energies on the order of 20 keV and above and a dose of 5E14/cm2, significant reduction in the sheet resistance of the silicided gate can be observed. FIG. 3 shows the results of a similar process for a 0.26 $\mu$m gate. Here, significant reduction in the sheet resistance can be observed for energies as low as 15 keV. A marked decrease in resistance variability can be observed in increasing the dose form 3E14/cm2 to 5E14/cm2 at 15 keV.

Figure 4A:
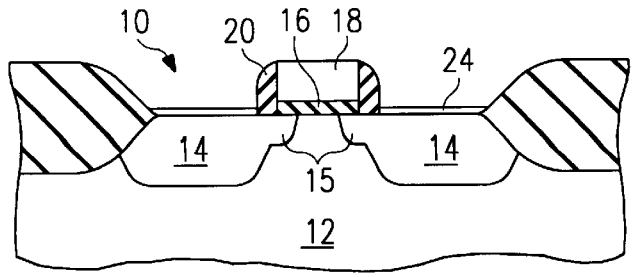
FIGS. 4a–e are cross-sectional diagrams illustrating a transistor undergoing the process according to a second embodiment of the invention Corresponding numerals and symbols in the different figures refer to corresponding parts unless otherwise indicated.

A method of forming narrow silicided polysilicon lines according to a second embodiment of the invention will now be discussed with reference to FIGS. 4a–4d. FIG. 4a is a cross-section of a transistor 10 processed through source/drain anneal. As in FIG. 1a, transistor 10 is formed in a semiconductor body 12 and includes source/drain regions 14, lightly-doped drain extensions 15, a gate oxide 16 and polysilicon gate electrode 18. Sidewall dielectric 20 is located on the sidewalls of gate oxide 16 and polysilicon gate electrode 18. Polysilicon gate electrode 18 is actually a long narrow polysilicon line that forms the gate electrode of several transistors. As device dimensions shrink, the width of polysilicon gate electrode 18 shrinks below 0.25 $\mu$m.

Figure 4B:
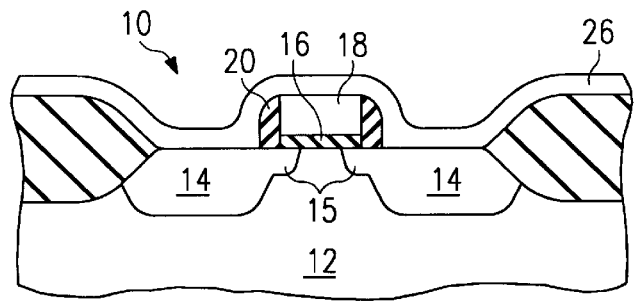

Referring to FIG. 4b, screen oxide is removed. Standard cleanup processes may then be performed. At this point, a layer of titanium 26 is deposited. The thickness of titanium layer 26 is chosen for conventional reasons (i.e., thickness desired for resulting silicide layer, device design parameters, etc.). For example, titanium layer 26 may be on the order of 300 Å thick.

Figure 4C:
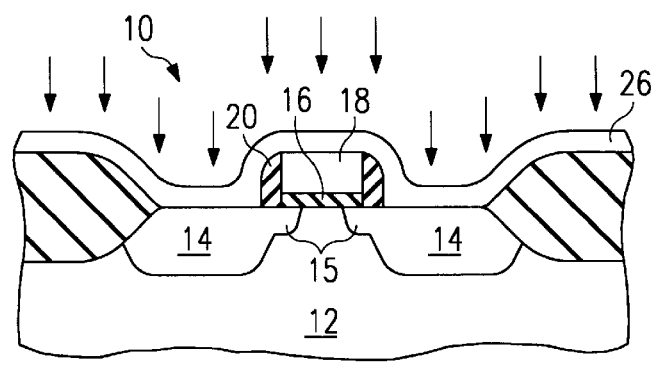

Prior to reacting titanium layer 26 with the silicon in polysilicon gate 18 and source/drain regions 14, a pre-amorphization implant is performed, as shown in FIG. 4c. As in the first embodiment, the implant is of a inert gas that does not poison the subsequent silicide reaction. Examples of gases that may be used include the noble elements such as Argon, Xenon, Neon, and Krypton. Using an inert gas that does not poison the silicide reaction instead of a dopant avoids both counterdoping the PMOS regions of a CMOS device and the masking requirement used to avoid counterdoping the PMOS regions.

The implant amorphizes the surface of the polysilicon gate electrode 18 and the source/drain regions 14 through the titanium layer 26. The dose of the implant is on the order of 3E14/cm2 and greater. The energy of the implant is adjusted to account for the overlying titanium latyer 26 such that the surface of the silicon is amorphizes to a depth less than the source/drain junction region. The titanium layer 26/silicon interface needs to be amorphous on the silicon side. Thus, the depth may typically be on the order of ½ the junction depth of the source/drain regions 14. If the amorphized region extends passed the junction depth, the implant can interfere with transistor operation causing increased leakage. Preferably, the depth of the amorphized region is matched to the amount of the source/drain regions 14 and polysilicon gate electrode 18 that will be consumed during the subsequent silicide formation. Thus, the optimum dose and energy will vary depending on the element implanted, the design parameters of the transistor 10, and the thickness of titanium layer 26. As an example, for an argon pre-amorphization implant, a 20 KeV Ar at a dose of 3e14 cm$^{-2}$ may be used.

Figure 4D:
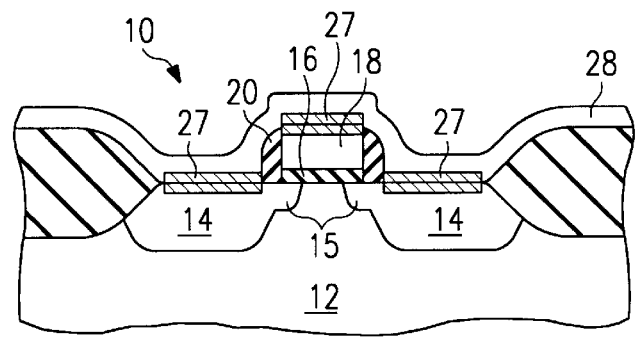

Referring to FIG. 4d, the titanium layer 26 is then reacted with the silicon in source/drain regions 14 and polysilicon gate electrode 18 in an nitrogen ambient to form a silicide layer 27. For example, a rapid thermal process on the order 700° C. for on the order of 60 seconds may be used. However, an appropriate furnace treatment may also be used. This react process creates a silicide in a mostly high resistivity phase, known as C49. The pre-amorphization implant of the inert gas causes the C49 grain size to be smaller than it otherwise would be. The C49 grain size created with the pre-amorphization implant is smaller than the polysilicon gate electrode width Having a C49 grain size smaller than the linewidth makes it easier to transform a higher percentage of silicide layer 27 from the C49 phase to a lower resistivity C54 phase during the subsequent anneal. When the polysilicon linewidth is less than the C49 grain size, the thermal budget required to transform the C49 phase to the C54 phase increases dramatically leading to agglomeration By optimizing the pre-amorphization implant, RTP react process and the subsequent RTP anneal process, a C49 grain size on the order of 0.07 $\mu$m can be achieved.

Figure 4E:
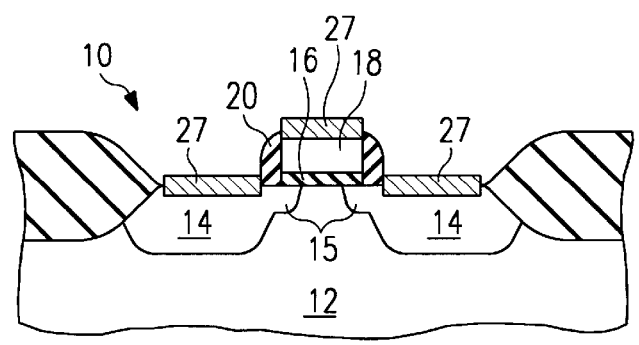

In places where there is no silicon for the titanium layer 26 to react with, titanium nitride 28 is formed. There may also be some unreacted titanium left. As shown in FIG. 4e, the titanium nitride 28 and unreacted titanium 26 are then removed. Finally, a silicide anneal is performed to transform the titanium-silicide of silicide layer 27 from a higher resistivity C49 phase to a lower resistivity C54 phase. This anneal may be performed either as a rapid thermal process (RTP) or in a furnace. For example, an RTP process at a temperature on the order of 850° C. for on the order of 30 sec. may be used.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description It is therefore intended that the appended claims encompass any such modifications or embodiments.

What is claimed is:

1. A method of forming a narrow silicided polysilicon line, comprising the steps of:

forming a polysilicon line on a semiconductor body;

implanting a gas that does not poison a subsequent silicidation reaction into said polysilicon line and said semiconductor body;

depositing a layer of titanium over said polysilicon line after said implanting step;

reacting said layer of titanium with said polysilicon layer to form a suicide layer, wherein said implanted gas causes a grain size of said silicide layer to be reduced; and annealing said silicide layer to transform the silicide layer from a higher resistivity phase to a lower resistivity phase.

2. The method of claim 1, wherein said gas is a noble element.

3. The method of claim 1, wherein said gas is implanted at a dose on the order of 3E14/cm2 or greater.

4. The method of claim 1, wherein said implanting a gas step occurs after said depositing a layer of titanium step.

5. The method of claim 1, further comprising the step of forming a source/drain region after said step of forming said polysilicon line and prior to said steps of implanting a gas and depositing a layer of titanium, wherein an energy of said implanting a gas step is chosen such that said gas is implanted to less than one half of a junction depth of said source/drain region.

6. The method of claim 1, wherein said gas is implanted to a depth approximately equal to a depth of a portion of said polysilicon line that is consumed by said reacting step.

7. The method of claim 1, wherein said gas is implanted to a depth less than a depth of a portion of said polysilicon line that is consumed by said reacting step.

8. The method of claim 1, wherein said implanting a gas step implants said gas at a dose sufficient to amorphize the surface of said polysilicon line.

9. The method of claim 1, wherein said reacting step is a rapid thermal anneal that occurs in a nitrogen ambient at a temperature on the order of 700° C., and further comprising the step of removing any unreacted portions of said titanium layer and a layer of titanium nitride formed during said reacting step prior to said annealing step.

10. The method of claim 1, wherein said annealing step is a rapid thermal anneal at a temperature in the range of 700–950° C.

11. A method of forming a silicided polysilicon line having a linewidth less than 0.25 $\mu$m, comprising the steps of:

forming a polysilicon line on a semiconductor body;

forming a source/drain region adjacent said polysilicon line in said semiconductor body;

implanting a noble element using a blanket implant to amorphize a surface of said polysilicon line;

depositing a layer of titanium over said semiconductor body including said polysilicon line and said source/drain region after said implanting step;

reacting said layer of titanium with said polysilicon line and said source/drain region to form a silicide layer, wherein said silicide layer has a reduced grain size due to said implanting step; and annealing said silicide layer to transform said silicide layer from a higher resistivity phase to a lower resistivity phase.

12. The method of claim 11, wherein said noble element is argon.

13. The method of claim 11, wherein said noble element is xenon.

14. The method of claim 11, wherein said noble element is implanted at a dose on the order of 3E14/cm2 or greater.

15. The method of claim 11, wherein an energy of said implanting a noble element step is chosen such that said noble element is implanted to less than one half of a junction depth of said source/drain region.

16. The method of claim 11, wherein said noble element is implanted to a depth approximately equal to or less than a depth of a portion of said polysilicon line that is consumed by said reacting step.

17. The method of claim 11, wherein said reacting step is a rapid thermal anneal that occurs in a nitrogen ambient at a temperature on the order of 700° C., and further comprising the step of removing any unreacted portions of said titanium layer and a layer of titanium nitride formed during said reacting step prior to said annealing step.

18. The method of claim 11, wherein said annealing step is a rapid thermal anneal at a temperature in the range of 700–950° C.

* * * * *